United States Patent [19]

Lee

[11] Patent Number: 5,875,112
[45] Date of Patent: *Feb. 23, 1999

[54] METHODS FOR IMPLEMENTING CIRCUIT DESIGNS IN PHYSICAL CIRCUITS

[75] Inventor: Jan Young Lee, Palo Alto, Calif.

[73] Assignee: Altera Corporation, San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 619,073

[22] Filed: Mar. 20, 1996

[51] Int. Cl.$^6$ ........................................................... G06F 17/00
[52] U.S. Cl. .......................... 364/489; 364/578; 364/488; 364/490; 364/491
[58] Field of Search ..................... 364/578, 488, 364/489, 490, 491; 395/500

[56] References Cited

U.S. PATENT DOCUMENTS

| | | | |
|---|---|---|---|
| 5,249,133 | 9/1993 | Batra ........................................ | 364/489 |
| 5,260,611 | 11/1993 | Cliff et al. .............................. | 307/465 |
| 5,448,493 | 9/1995 | Topolewski et al. .................... | 364/489 |
| 5,463,561 | 10/1995 | Razdan .................................... | 364/489 |
| 5,519,630 | 5/1996 | Nishiyama et al. ..................... | 364/490 |
| 5,526,517 | 6/1996 | Jones et al. ............................. | 395/600 |

OTHER PUBLICATIONS

"Hcompare: A Hierarchical Netlist Comparison Program", Batra et al. 1992 IEEE, pp. 299–303, 1992.
"A Circuit Comparison System With Rule Based Functional Isomorphism Checking", Takashima et al., 1988 IEEE, pp. 512–516, 1988.
"An Improved Layout Verification Algorithm", Abadir et al., 1990 IEEE, pp. 391–395, 1990.
"A Network Comparison Algorithm for Layout Verification of Integrated Circuits", Barke, 1984 IEEE, pp. 135–141, 1984.
"YNCC: A New Algorithm for Device–Level Comparison Between Two Functionally Isomorphic VLSI Circuits", Shiran, 1986 IEEE, pp. 298–301, 1986.
"WOMBAT: A New Netlist Comparison Program", Spickelmier et al., 1983 ICCAD, pp. 170–171, 1983.
C. Ebeling et al., "Validating VLSI Circuit Layout by Wirelist Comparison," 1983 IEEE International Conference on Computer Aided Design, pp. 172–173.
J. D. Tyger et al., "Efficient Netlist Comparison Using Hierarchy and Randomization," IEEE 22nd Design Automation Conference, 1985, pp. 702–708.
L. G. Jones, "Fast Incremental Netlist Compilation of Hierarchical Schematics," 1989 IEEE International Conference on Computer Aided Design, pp. 326–329.
G. Pelz et al., "Circuit Comparison by Hierarchical Pattern Matching," 1991 IEEE International Conference on Computer Aided Design, pp. 290–293.
"MAX+PLUS II Getting Started," Version 5.0, Jul. 1994, Altera Corporation, San Jose, California.
"MAX+PLUS II AHDL," Version 5.0, Jul. 1994, Altera Corporation, San Jose, California.
"Efficient Netlist Comparison Using Hierarchy and Randomization". J.D. Tygar et al, 1985 IEEE pp. 702–708.
"Circuit Comparison by Hierarchical Pattern Matching" George Pelz et al., 1991 IEEE pp. 290–293.

*Primary Examiner*—Kevin J. Teska
*Assistant Examiner*—A. S. Roberts
*Attorney, Agent, or Firm*—Fish & Neave; Robert R. Jackson; Michael E. Shanahan

[57] ABSTRACT

In order to reduce the amount of work that must be done to implement a revised circuit design in physical circuitry, portions of the new design that are the same as a previously implemented design are identified. This preferably involves several different, successively applied approaches to attempting to find matching circuit components in the new and old designs. Connections that have changed between otherwise unchanged components are also identified. The physical circuit implementation of the unchanged portions of the old design can be reused in the implementation of the new design, thereby reducing the amount of new physical circuit implementation work that must be done.

20 Claims, 10 Drawing Sheets

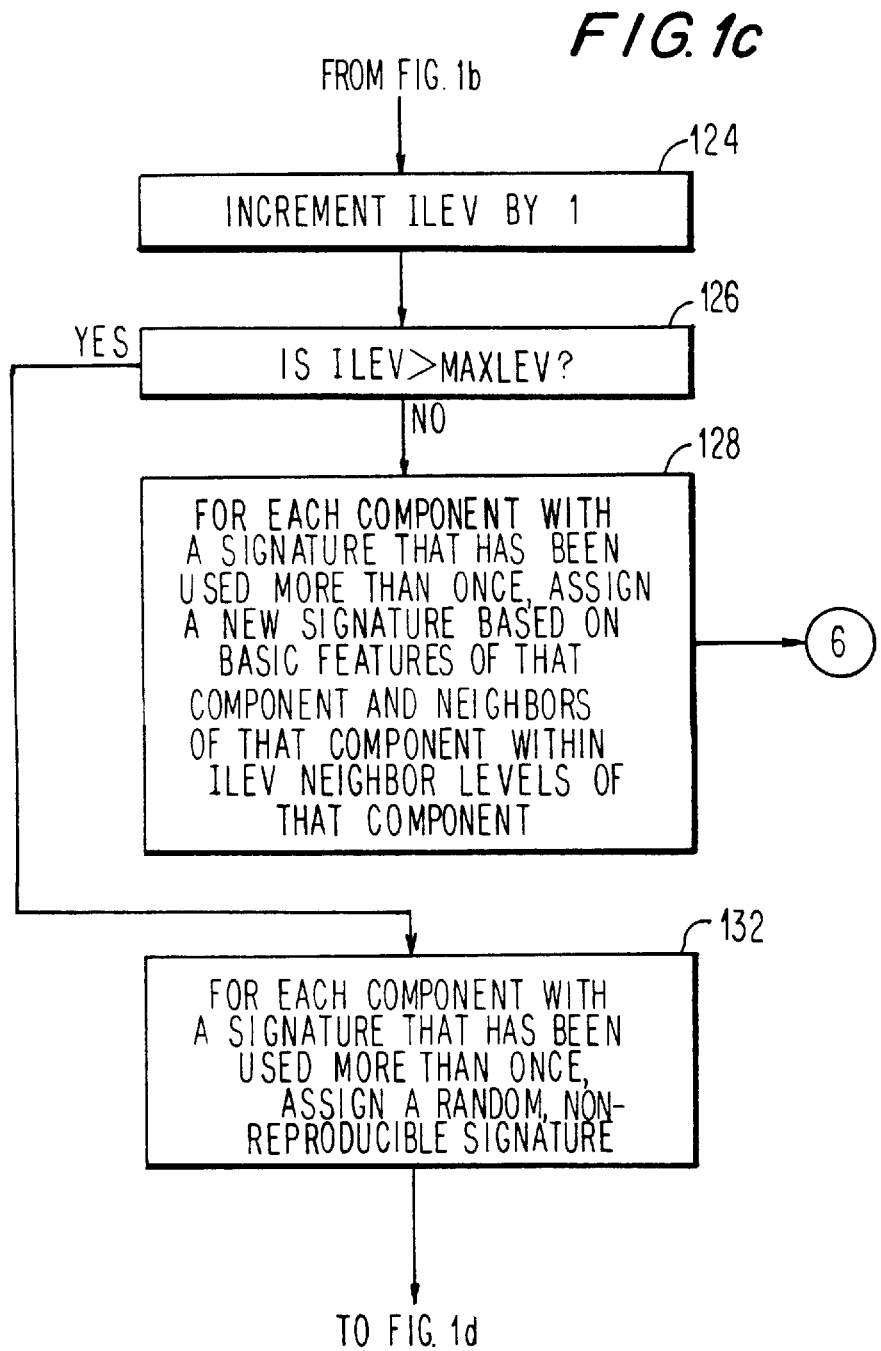

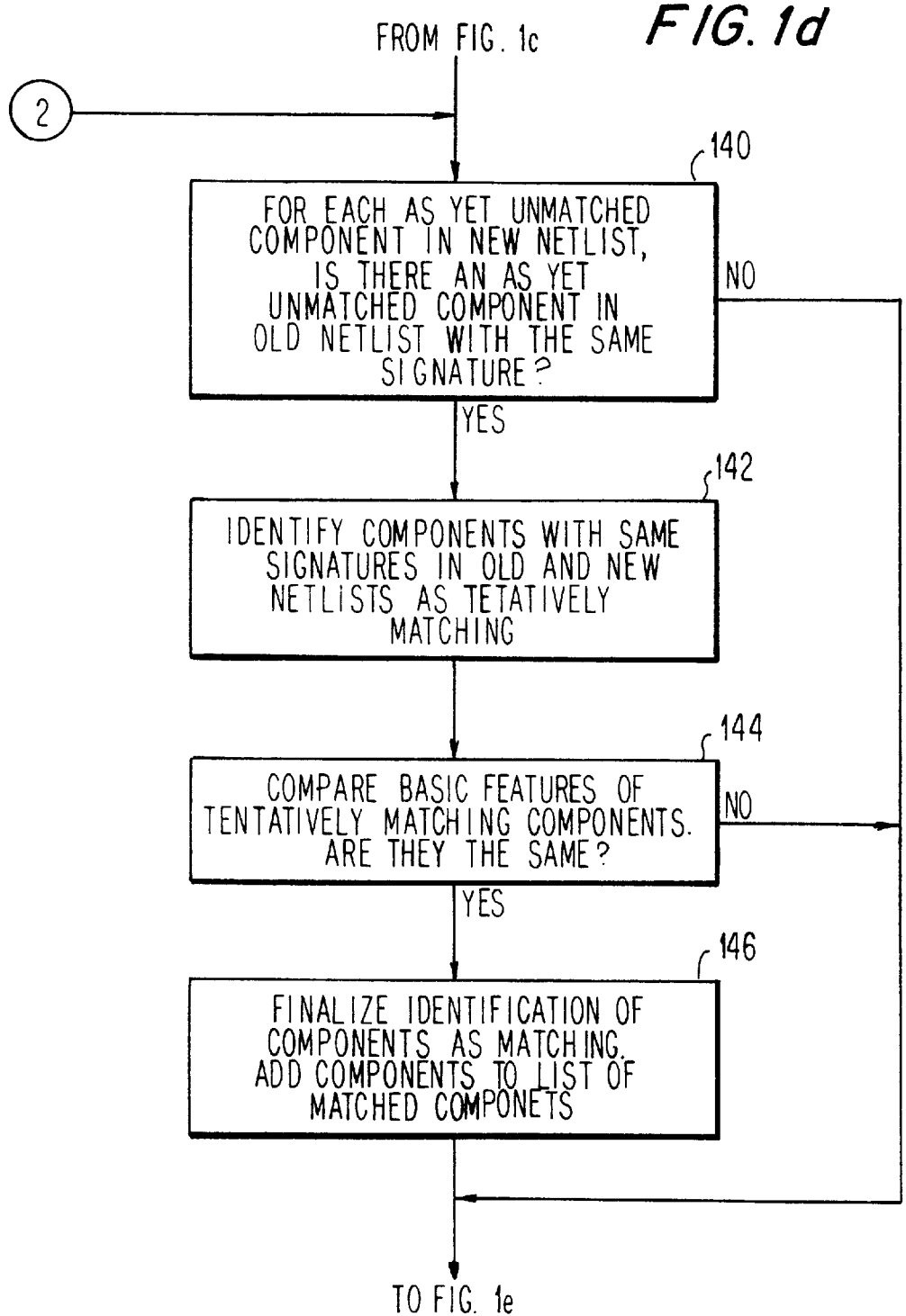

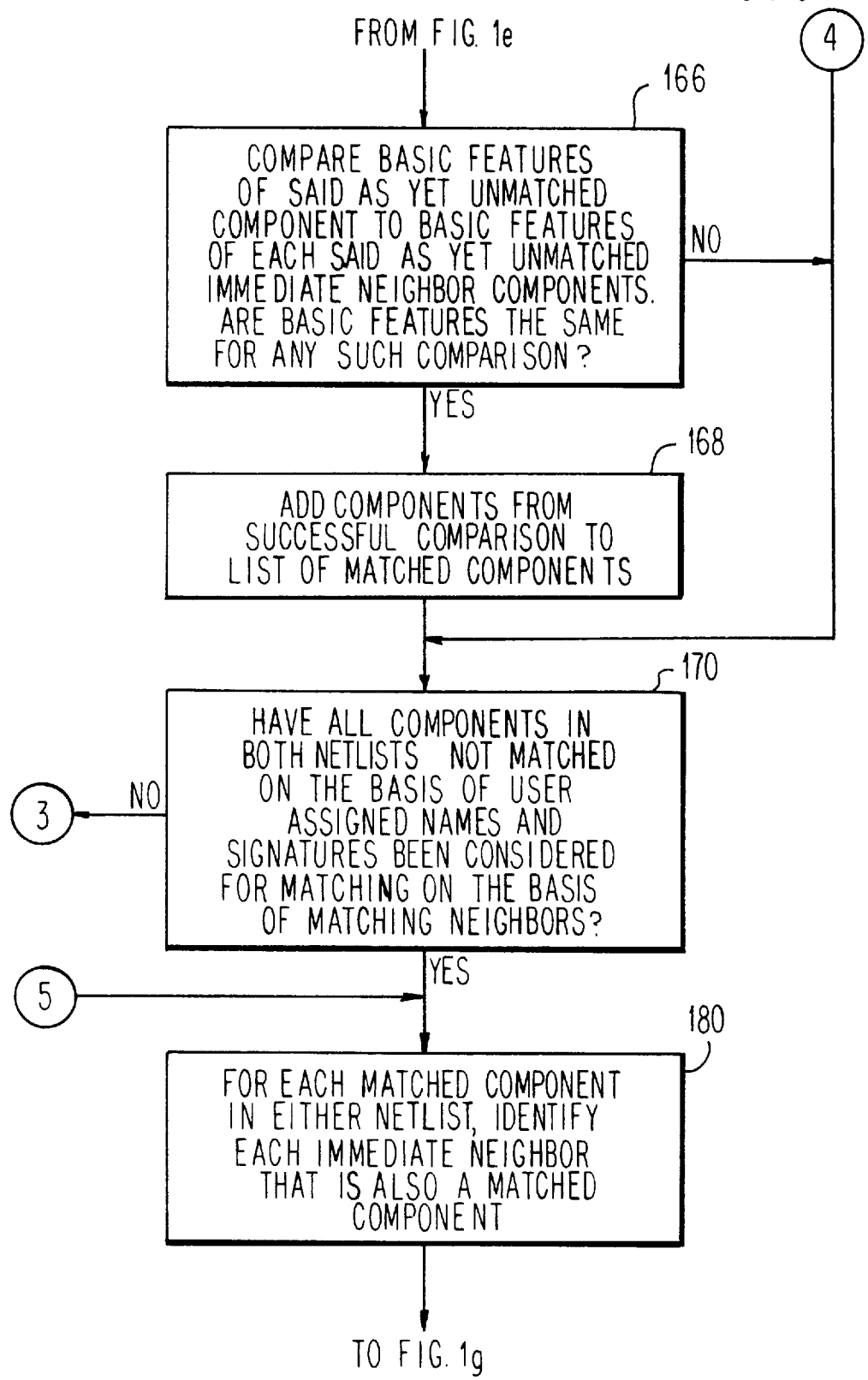

METHODS FOR IMPLEMENTING CIRCUIT DESIGNS IN PHYSICAL CIRCUITS

BACKGROUND OF THE INVENTION

This invention relates to methods for implementing circuit designs in physical circuits, and more particularly to comparing two circuit designs so that as much as possible of work that has been done with regard to implementing a first circuit design can be reused in implementing the second circuit design.

The task of implementing a complex electrical circuit design in physical circuitry can be a formidable one. For example, there are various types of general purpose, programmable circuit devices that can be used to implement a wide variety of circuit designs. Illustrative of these types of devices are programmable logic arrays ("PLAs"), field programmable gate arrays ("FPGAs"), and other similar programmable integrated circuit devices. (See Cliff et al. U.S. Pat. No. 5,260,611 and commonly assigned, co-pending U.S. patent application Ser. No. 08/442,795, filed May 17, 1995, for examples of PLA devices. These documents are hereby incorporated by reference herein.) Typically, in the use of these kinds of devices the user devises a logic circuit design for performing desired logic functions. This circuit-design phase may be computer assisted (e.g., using a system such as the MAX+PLUS II Programmable Logic Development System, which is commercially available from Altera Corporation of San Jose, Calif., and which is described, for example, in the Altera publications "MAX+PLUS II Getting Started", Version 5.0, July 1994, and "MAX+PLUS II AHDL", Version 5.0, July 1994, both of which are hereby incorporated by reference herein.) Additional modules of this computer software are then frequently used to translate the user's circuit design into a set of components and inter-component connections that can be implemented in the physical circuitry of the device to be used to implement the design. For example, this process may involve breaking the user's circuit design into a plurality of components, each of which is implementable in a respective one of the physical circuit components of the intended device. (In this case a physical circuit component may be a logic gate, a logic module (e.g., circuitry capable of forming any logical combination of several inputs), or a logic array block (e.g., several interconnected logic modules).) In addition, all necessary connections between the circuit design components are identified for implementation in the interconnection resources of the intended device. Such a decomposition of the user's logic design may be embodied in a structured list of all required logic components and their interconnections. A list of this type is sometimes referred to as a "netlist," and that term is therefore employed herein with that meaning.

After a netlist has been generated, considerable further work must often be done—again by other portions of the above-mentioned software—to decide how the netlist circuitry will actually be implemented in physical circuitry. This process may involve such steps as synthesis (i.e., determining how a unit of available physical circuitry will be programmed to implement each design component), partitioning (i.e., grouping the design components into clusters that fit into available physical circuit clusters without excessive interconnections being required between the clusters), and placing and routing (i.e., assigning each design circuit cluster to a particular respective physical circuit cluster so that required connections can be made between the clusters without any required connection being blocked by other required connections).

Because so much computational effort often goes into implementing a netlist, it would be desirable to be able to reuse as much of that work as possible when there is a change in the circuit design.

In view of the foregoing, it is an object of this invention to provide methods for implementing circuit designs in physical circuitry which reduce the need to re-perform such steps as circuit synthesis, circuit partitioning, and circuit placement and routing when the circuit design changes.

It is a more particular object of this invention to provide methods for comparing netlists of circuit designs before and after design changes in such a way that unchanged portions of the design are identified so that the work of implementing those portions of the circuit can be reused in implementing the changed design.

SUMMARY OF THE INVENTION

These and other objects of the invention are accomplished in accordance with the principles of the invention by comparing netlists of circuit designs before and after design changes. Components of the two circuit design netlists having the same user-assigned names are tentatively matched to one another. Each such tentative match is further tested by comparing certain basic features of the tentatively matched components. If the basic features are also the same, the tentative match is verified or made final, and the matched components are added to a set of components that are common to the two netlists.

After all components have been considered for matching as described above, the as yet unmatched components are further considered for possible matches by generating a signature for each as yet unmatched component based on certain basic features of that component. The same signature-assigning algorithm is used for both netlists. However, this signature-assigning algorithm avoids assigning the same signature to any two components within either netlist by (if necessary) additionally considering the basic features of components that are neighbors of the component being given a signature, and even (if further necessary) the basic features of components that are neighbors of those neighbor components. At a certain point, however, if uniqueness of signatures is not achieved by additionally considering neighboring components, the process of considering more remote neighbors stops and a random, non-reproducible signature is assigned to the component. After signatures have been assigned to all as yet unmatched components in both netlists, signatures from the two netlists that match are identified. The basic features of components with matching signatures are then compared, and if these features are also the same, these components are added to the set of components that are common to the two netlists.

The components that have not been matched in either of the two preceding matching phases are then further considered. If such a component has a neighboring component that has a matching component in the other netlist, then the basic features of that component are compared to the basic features of components in the other netlist that neighbor the matching component in the other netlist. If a basic feature set match is found, the associated components are added to the set of components that are common to both netlists.

After the foregoing component-matching procedures have been completed, inter-component connections are considered. For each matched component, if a matched immediate neighbor of that component is not matched to one of the immediate neighbors of that component's match in the other netlist, then the connection between that component and that matched immediate neighbor is marked as changed.

The end result of the foregoing process is identification of (1) components that match, (2) components that do not match, and (3) changed connections. This identification is available for both the old and new netlists. Matched components in the old and new netlists represent unchanged parts of the netlists. Unmatched components in the old netlist represent deleted regions of that netlist. Unmatched components in the new netlist represent new regions in that netlist. Marked connections represent changed connections between unchanged components in the two netlists. This information can be used to identify those portions of post-netlist processing (performed for the old netlist) that can be reused for the new netlist. Conversely, this information also identifies those portions of the post-netlist work that must be re-performed for the new netlist.

Further features of the invention, its nature and various advantages will be more apparent from the accompanying drawings and the following detailed description of the preferred embodiments.

BRIEF DESCRIPTION OF THE DRAWINGS

FIGS. 1a–1g (collectively referred to as FIG. 1) are a flow chart of an illustrative embodiment of the methods of this invention.

DETAILED DESCRIPTION OF THE PREFERRED EMBODIMENTS

Figure 1A:
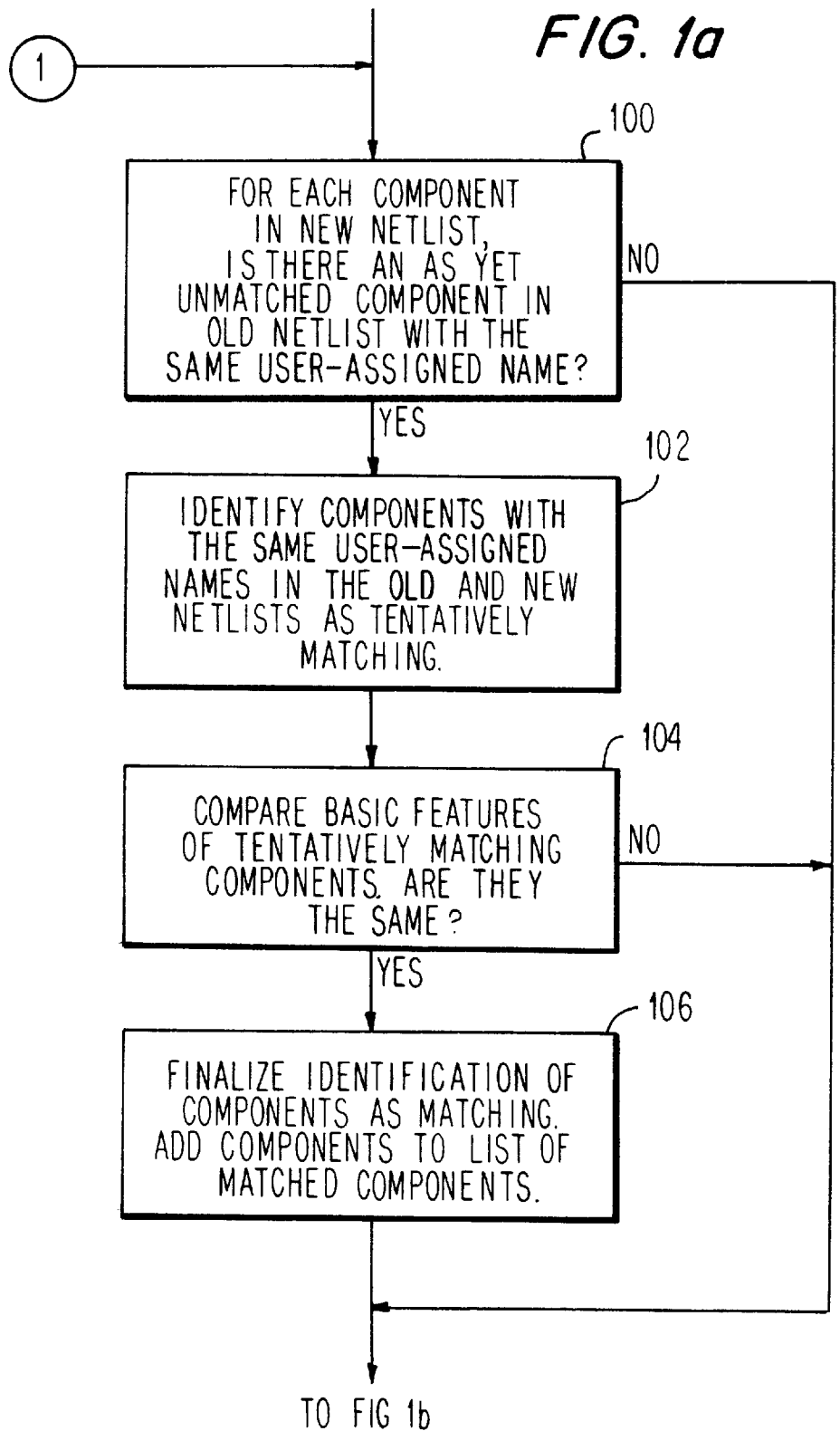
Figure 1B:
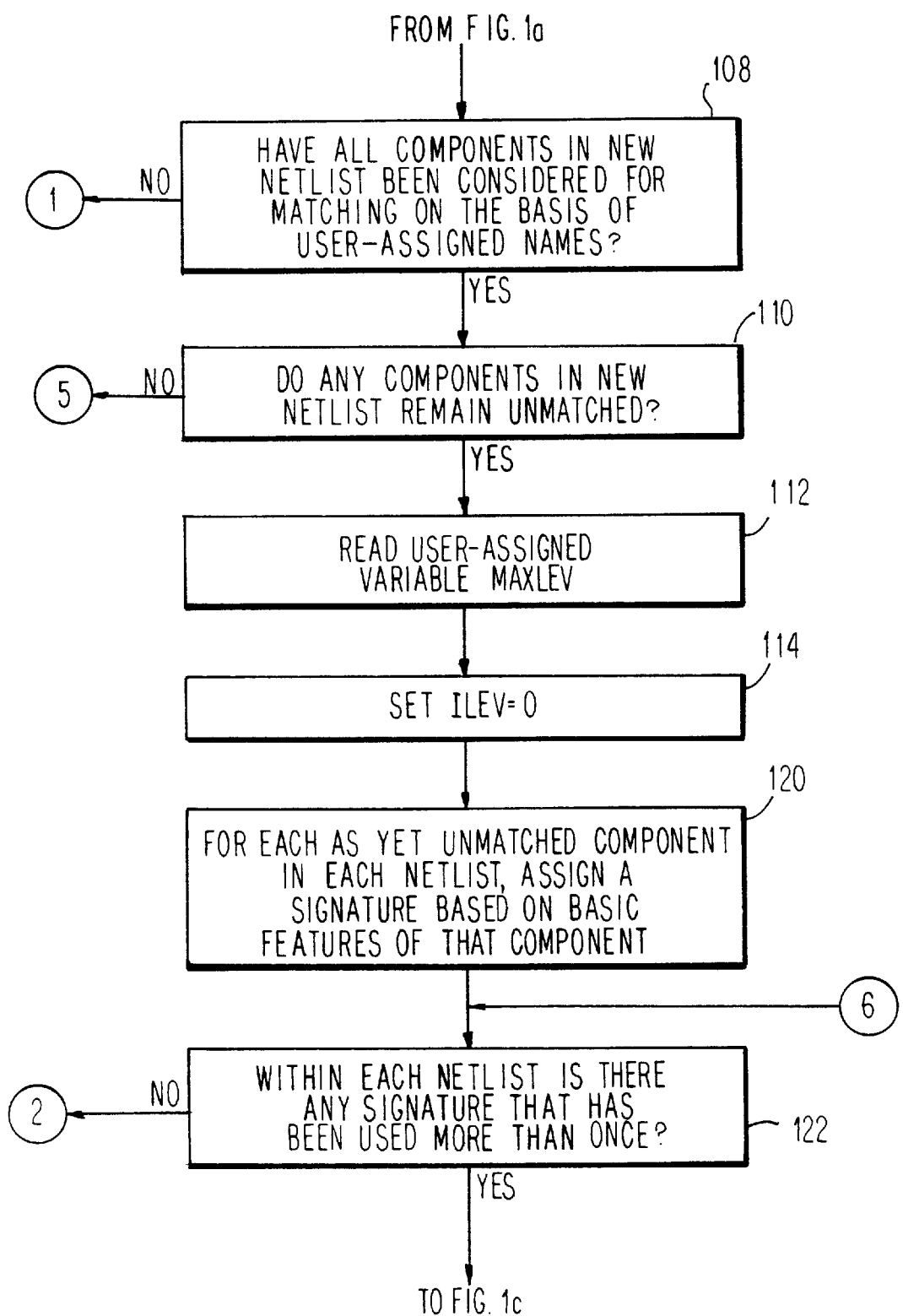
Figure 1E:
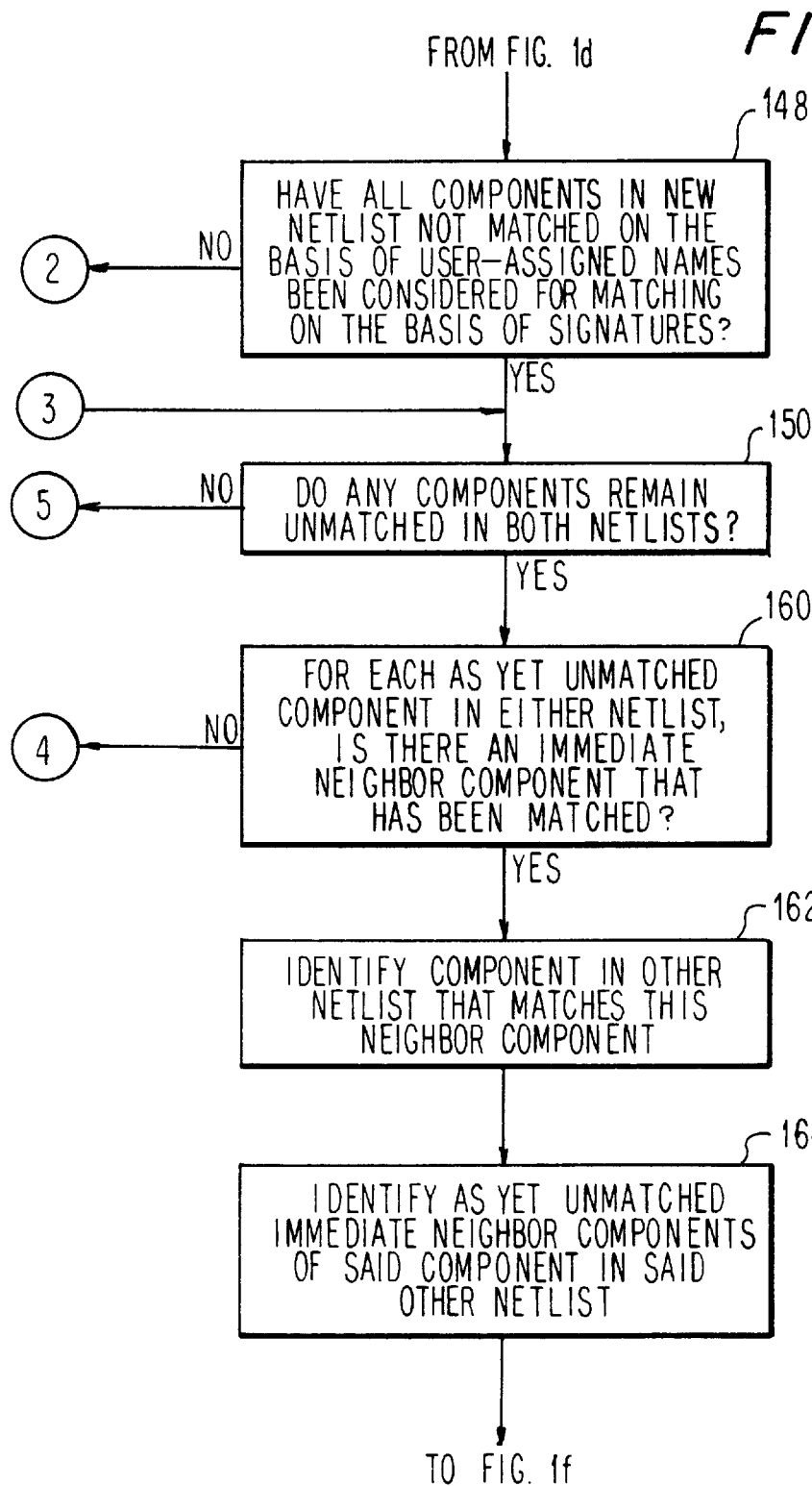
Figure 1G:
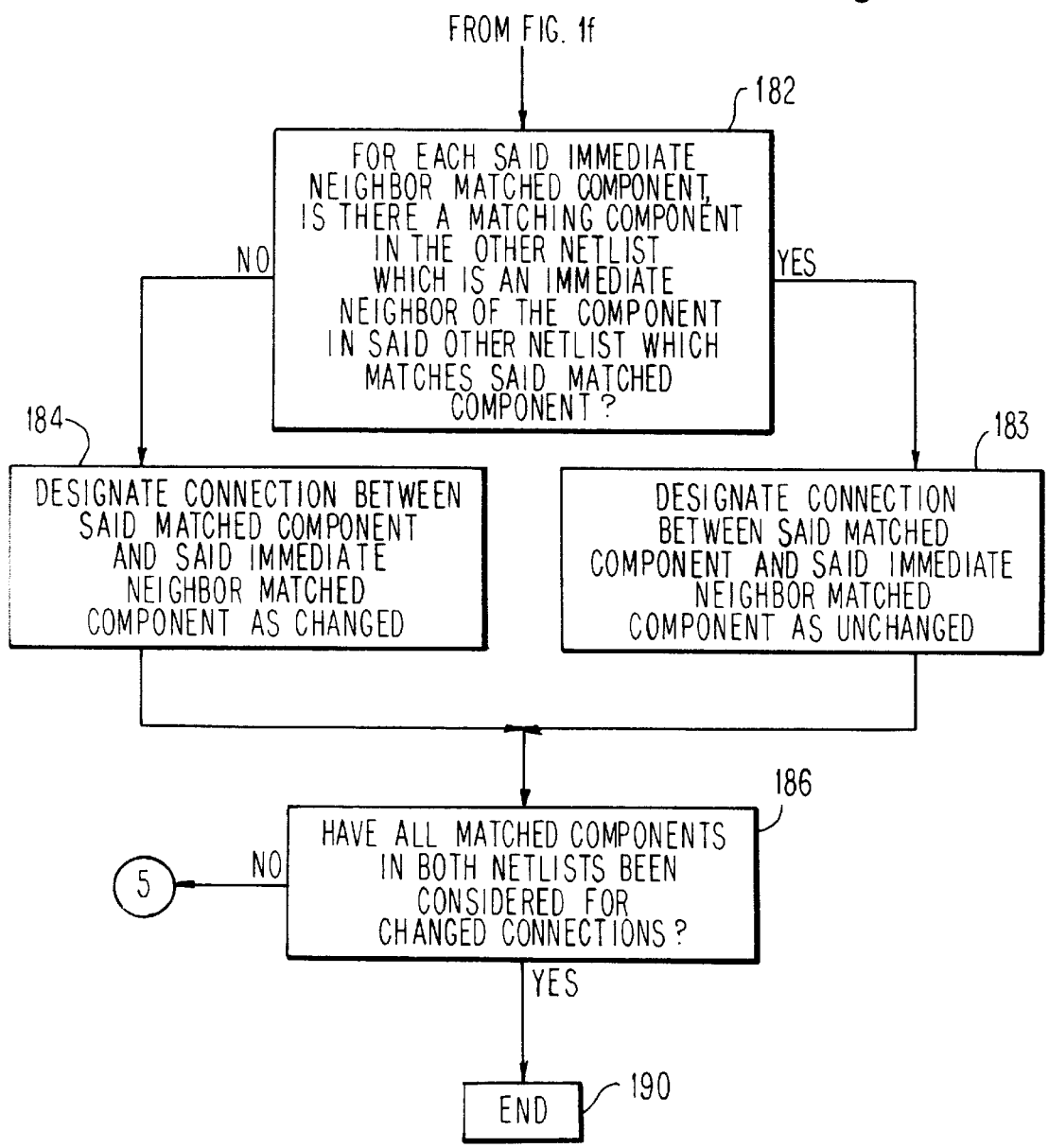
Figure 2A:
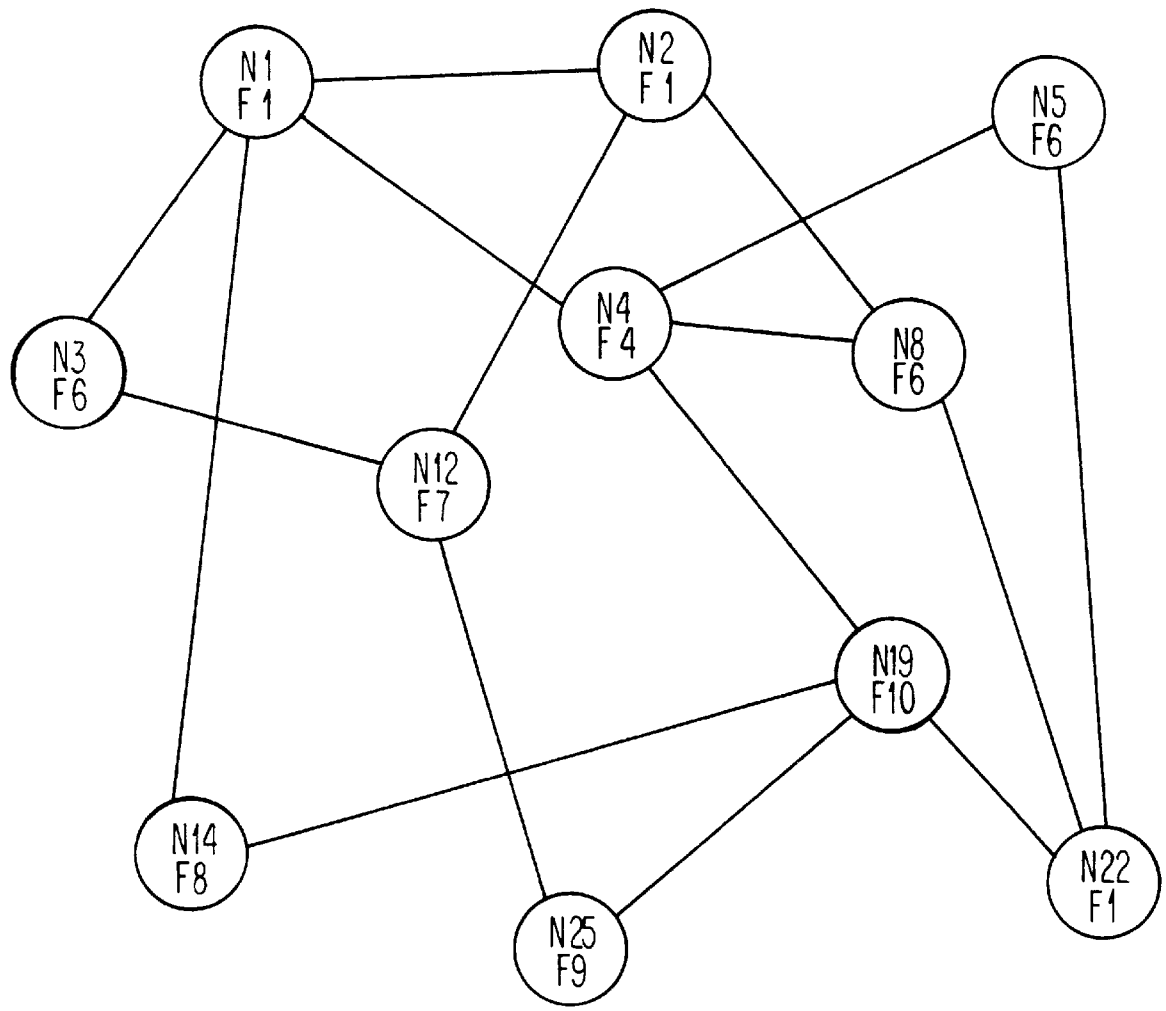
FIG. 2a is a diagrammatic representation of information about an illustrative circuit design, which information can be used by the methods of this invention.
Figure 2B:
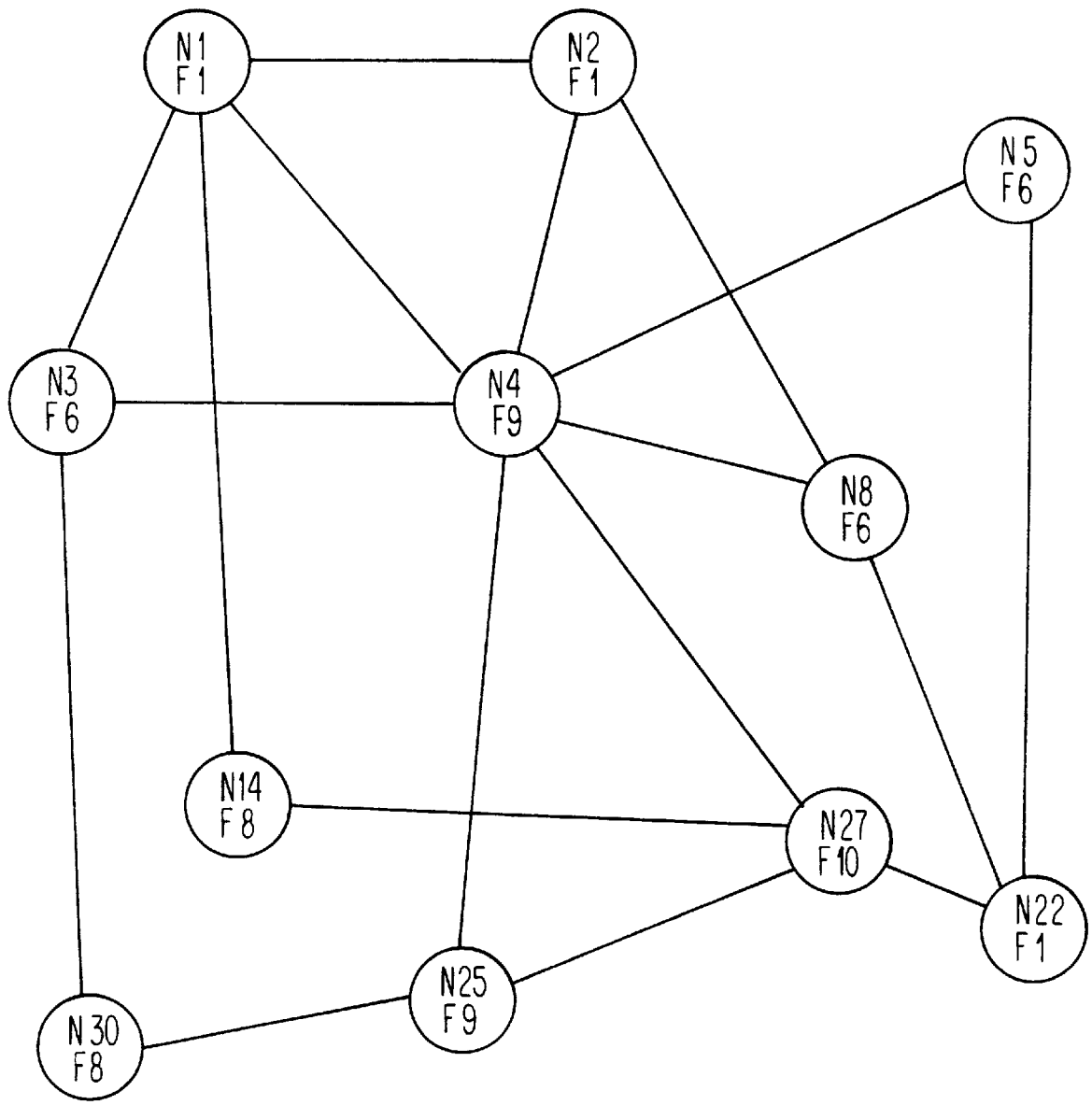
FIG. 2b is similar to FIG. 2a, but shows information for a modification of the FIG. 2a circuit design. This information is used with the FIG. 2a information by the methods of this invention.

For purposes of illustration, some of the data contained in two circuit design netlists is represented graphically in FIGS. 2a and 2b. Although netlists are typically structured data lists in a computer database, for present purposes it is easier to represent relevant aspects of that data graphically as in FIGS. 2a and 2b. FIG. 2a shows a netlist for an "old" design, while FIG. 2b shows a netlist for a "new" design (i.e., a design which has substantial similarities to the old design, but also some differences from that old design). In each netlist each circle represents a "component" of the circuit design. For example, a component may be a logic gate or group of logic gates, a register, etc. Each straight line represents an inter-component connection in the circuit design. Each component has been given a name by the circuit designer or "user." For ease of reference herein, all names begin with the letter N (e.g., N1, N2, N3, etc.). Each component also has a set of basic features, identified herein by the shorthand references which begin with the letter F (e.g., F1, F4, F6, etc.). Any of a wide range of component parameters can be included among those that form the so-called basic feature set or characterization of each component. For example, the basic features may include the general type or function of the component, the number of connections it has to other components, etc. The basic features of the various components typically distinguish many components from one another, but they do not typically distinguish each component from all others. Thus it will be seen that in each of the netlists of FIGS. 2a and 2b some of the basic features (e.g., F1 and F6) appear in more than one component. Some of the components shown in FIGS. 2a and 2b may be inputs to and/or outputs from the depicted circuitry.

To briefly review the differences between the circuit designs represented by the netlists of FIGS. 2a and 2b, the components with names N1, N2, N3, N5, N8, N14, N22, and N25 appear to be unchanged from FIG. 2a to FIG. 2b. Each of these components has the same name and the same basic features in both FIGS. The component with the name N4 appears to have changed because its basic features F4 in FIG. 2a become F9 in FIG. 2b. The component with the name N12 in FIG. 2a appears to have been eliminated from the FIG. 2b circuit design. The component name N19 in FIG. 2a is not reused in FIG. 2b, although that component may have been replaced by component N27 (note that components N19 and N27 have the same basic features). Component N30 appears to be new in FIG. 2b.

While the netlists shown in FIGS. 2a and 2b do not require use of all the features of the present invention, they do illustrate use of some of those features. Basically, the principal objective of the methods of this invention is to find portions of a new netlist (e.g., FIG. 2b) that are sufficiently similar to an old netlist (e.g., FIG. 2a) so that for those portions of the new circuit design the detailed work that has already been done to implement the old circuit design can be reused. New design implementation work will therefore only have to be done for those portions of the new circuit design that are not sufficiently similar to the old design. In present terms, circuit design components in two netlists that are basically the same as one another are said to "match."

Turning now to the illustrative embodiment of the methods of this invention which is shown in FIG. 1, the process begins with step 100 in which each component in the new netlist is considered in turn. (Step 100 could alternatively be performed by considering each component in the old netlist in turn, but the result will be exactly the same whichever netlist is treated as the reference list.) In step 100 the user-assigned name (e.g., N1, N2, N3, etc.) of each component in the new netlist is searched for among the names of the as yet unmatched components in the old netlist in order to identify (in step 102) tentatively matching components in the old netlist. In this way components N1, N2, N3, N4, N5, N8, N14, N22, and N25 in FIG. 2b will be tentatively identified as respectively matching the similarly named components in FIG. 2a. Steps 102–106 are bypassed for any new netlist components whose user-assigned names are not found in 10 the old netlist. Thus steps 102–106 will be skipped for components N27 and N30 in FIG. 2b.

In step 104 the basic features of the tentatively matched components are compared. If the basic features of the tentatively matched components are the same, step 106 is performed to finalize the matching of those components by adding them to a list of components that have been found to match between the old and mew netlists. Step 106 will be performed for components N1, N2, N3, N5, N8, N14, N22, and N25 in FIG. 2b. However, step 106 will be bypassed for component N4 in FIG. 2b because the basic features of that component are not the same in FIGS. 2a and 2b. The tentative matching of components N4 in FIGS. 2a and 2b will therefore be withdrawn when step 106 is bypassed for that component name.

Step 108 is a bookkeeping step which returns control to step 100 until appropriate ones of steps 100–106 have been performed for all components in the new netlist. Thereafter step 108 passes control to step 110.

Step 110 is another bookkeeping step which passes control to step 112 if any components in the new netlist remain unmatched after steps 100–108 have been performed for all new netlist components. On the other hand, if no new netlist components remain unmatched, step 110 passes control to step 180. In the particular example illustrated by FIGS. 2a and 2b components N4, N27, and N30 remain unmatched when step 110 is performed, and so control passes from step 110 to step 112.

Step 112 begins a series of steps that attempt to match components based on their basic features (in the event that the name but not the basic features of a component have been changed). In step 112 a user-assigned variable MAXLEV is read to establish the maximum number of levels of neighboring components that will be considered in an effort to avoid assignment of the same signature to more than one component in either netlist. For example, if MAXLEV is 0, only the basic features of a component will be considered in assigning a signature to that component. If MAXLEV is 1, the basic features of a component and its immediate neighbor components may be considered in assigning a signature to the component (assuming that the component does not receive a unique signature based solely on its own basic features). (A component is an immediate neighbor of another component if there is a direct connection between the two components.. For example, in FIG. 2a the immediate neighbors of component N1 are components N2, N3, N4, and N14.) If MAXLEV is 2, the basic features of a component, its immediate neighbors, and immediate neighbors of those immediate neighbors may be considered in assigning a signature to the component (assuming that the component does not receive a unique signature based on its own basic features and the basic features of its immediate neighbors). Still higher values of MAXLEV may be used if desired.

In step 114 an index variable ILEV is initialized to 0.

In step 120 the basic features of each as yet unmatched component in each netlist is used to assign a signature to that component. The signature assigning technique (an example of which is discussed somewhat later) is such that any components with the same basic features will be assigned the same signature, but components with different basic features will receive different signatures. Thus in step 120 components N4, N12, and N19 in FIG. 2a are assigned signatures based on their basic features F4, F7, and F10, respectively, and components N4, N27, and N30 in FIG. 2b are assigned signatures based on their basic features F9, F10, and F8, respectively.

After step 120 has been performed, step 122 is performed to determine whether any signature has been used more than once in either netlist. Ultimately it is desired for the signatures used for each netlist to be all unique. In the particular example shown in FIGS. 2a and 2b this will be the case for both netlists because the three components from each netlist considered in step 120 all have different basic features. Thus in this example control passes from step 122 to step 140. However, if for either netlist step 120 resulted in any signatures being duplicated, control would pass from step 122 to step 124 to begin a process for eliminating such duplicated signatures. For example, if component N30 in FIG. 2b had basic features F9 instead of F8, step 120 would result in duplicate signatures for components N4 and N30. Steps 124 et seq. would then be performed to eliminate this signature duplication.

In step 124 the index variable ILEV is incremented by 1.

In step 126 the current value of ILEV is compared to MAXLEV. If ILEV is greater than MAXLEV, control passes from step 126 to step 132, which will be discussed below. On the other hand, if ILEV is not yet greater than MAXLEV, control passes from step 126 to step 128.

In step 128 the signatures of any components with signatures that are duplicated in the same netlist are replaced by new signatures that are based on the basic features of that component and all components that are within ILEV neighbor levels of that component. Any signature assignment that is based in part on the basic features of neighboring components to a given number of neighbor levels is preferably biased toward being different from any signature assignment that is based on a lesser number of neighbor levels (to reduce the chances of creating new signature duplication).

After each performance of step 128, step 122 is performed again to repeat the test for signature uniqueness within each netlist. If any signature duplication is still present, steps 124 and 126 are repeated, and if MAXLEV is large enough, step 128 is performed again with a higher value for ILEV. Eventually, however, if ILEV exceeds MAXLEV without signature uniqueness being achieved within each netlist, then step 132 will be performed to just assign a random, non-reproducible signature to each component that has not otherwise received a unique signature within the netlist that includes that component. The signatures assigned in step 132 have a very high probability of being unique. For this reason, and because they are "forced," they are sometimes referred to for convenience herein as "necessarily unique" signatures (although there may in fact be a tolerably small probability that they are not unique). These "necessarily unique" signatures effectively eliminate any component with such a signature from matching on the basis of signature in step 140.

An illustrative example of a signature assigning technique (usable in steps 120 and 128) includes the following steps:
1. output=some_fixed_value
2. output=random_num1×(output^(feature×(neighbor_level+random_num2)))
3. go back to 1 for each feature of the component.

If ordering of the features does not matter, step 2 can be rewritten as follows:
2. output=(output^(feature×(neighbor_level+random_num2))

These steps are a hashing function that takes a numerical input and produces a numerical output. The input is a numerical representation of the basic features of a component (e.g., number of inputs/outputs, type of component, types of components at outputs, etc. The neighbor_level is an index value (similar to ILEV) up to the current value of ILEV. The symbols×, ^, and + indicate multiplication, EXCLUSIVE OR, and addition, respectively. All inputs and outputs are integer numerical values.

In step 140 an attempt is made to match each as yet unmatched component in the new netlist with each as yet unmatched component in the old netlist on the basis of finding components in the two netlists with the same signature. If the same signature is found in both netlists, step 142 is performed to tentatively match the associated components. Then in step 144 the basic features of the tentatively matched components are compared. If the basic features are the same, the tentative matching is finalized in step 146, and the matched components are added to the list of previously matched components. If the basic features are not the same, step 146 is bypassed, thereby discarding the tentative matching of these components. Step 148 is a bookkeeping step to return control to step 140 until all as yet unmatched components have been tested for matching on the basis of signature.

As in the case of step 100, the references in step 140 to the new and old netlists could be reversed with no change in the result.

In the particular example shown in FIGS. 2a and 2b performance of steps 140–148 will result in matching new netlist component N27 with old netlist component N19. Even though these components have different user-assigned names (i.e., N19 and N27), they have the same basic features and they are therefore matched in this phase of the method.

Step 150 is another bookkeeping step for determining whether the next phase of the method should be performed to continue to attempt to match components. If there are any still unmatched components in both netlists, control passes to step 160 to begin the next phase of the method. Otherwise control passes to step 180, thereby bypassing steps 160–170.

In step 160 each as yet unmatched component is considered to determine whether it has an immediately neighboring component that has been matched. If not, control passes to step 170 to begin consideration of the next as yet unmatched component. On the other hand, if the as yet unmatched component has a matched immediate neighbor, control passes from step 160 to step 162.

In step 162 the match in the other netlist of the immediate neighbor identified in step 160 is identified. Then in step 164 the immediate neighbors of the component identified in step 162 are identified. Next, in step 166, the basic features of each component identified in step 164 are compared to the basic features of the component being considered from step 160. If the basic features of one of the components identified in step 164 are found to be the same as the basic features of the component being considered from step 160, then in step 168 those two components are matched and added to the list of previously matched components. If no commonality of basic features is found in step 166, step 168 is bypassed and no match is made.

Matching components in accordance with step 166 may be additionally conditioned on the order of the connections to the two components being considered for matching. For some types of circuitry the order of connections to components may not matter. For other types of circuitry the order of connections does matter. For circuitry of the latter kinds, the user may additionally require step 166 to ensure that the order of the connections to components being considered for matching is the same before identifying those components as matched.

Step 170 is a bookkeeping step to make sure that control returns to step 160 as long as it is sensible to continue looking for matching components based on matching neighbors of as yet unmatched components.

FIGS. 2a and 2b do not require use of the portion of the invention which is the subject of steps 160–170. This portion of the invention tends to come into play for components whose signatures have to be based in part on basic features of neighboring components or whose signatures are forced to be random and non-reproducible (steps 124–132). While necessary in the signature matching phase of the invention, these forms of signature assignment can sometimes prevent matching that should take place. The search for matching components based on matched immediate neighbors (steps 160–170) can find such matches.

When step 180 is reached, the component-matching portion of the process is complete. In the particular example shown in FIGS. 2a and 2b, components N1, N2, N3, N5, N8, N14, N19, N22, and N25 in FIG. 2a will have been respectively matched with components N1, N2, N3, N5, N8, N14, N27, N22, and N25 in FIG. 2b. Components N4 and N12 in FIG. 2a and components N4 and N30 in FIG. 2b will be unmatched.

The final portion of the process (steps 180–190) relates to finding connections between matched components that have changed from the old netlist to the new netlist. In step 180 each matched component is considered in turn. Each matched immediate neighbor of the component being considered is identified. Then in step 182 the component in the other netlist which matches the component being considered is identified, as are the components in the other netlist which match the immediate neighbors of the component being considered. Still in step 182 it is determined whether each of the immediate neighbor matches is an immediate neighbor of the match of the component being considered. If this test is not satisfied for any of the immediate neighbors identified in step 180, then in step 184 the connection between the component being considered and that immediate neighbor is designated as changed. Step 183 (instead of step 184) is performed for immediate neighbors for which the test of step 182 is satisfied. Step 183 designates the connection being considered as unchanged.

Step 182 is another step (like step 166) that may be additionally conditioned on the order of connections to components. Again, for some types of circuitry the order of connections to components may not matter, while for other types of circuitry the order of connections does matter. For the latter kinds of circuitry, the user may additionally require step 182 to ensure that the order of the connections to components being considered for changed connections be the same before identifying connections as unchanged.

Step 186 is a bookkeeping step which returns control to step 180 until all matched components in both netlists have been considered for possibly changed connections. Then the process ends at step 190.

Figure 3A:
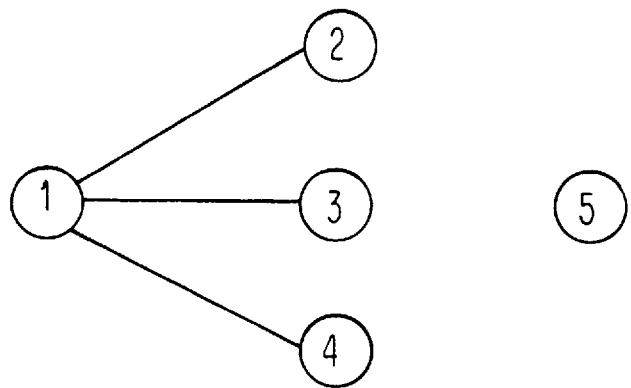
FIGS. 3a and 3b are respectively similar to FIGS. 2a and 2b, but show another example of illustrative circuit design information which can be used by the methods of this invention.
Figure 3B:
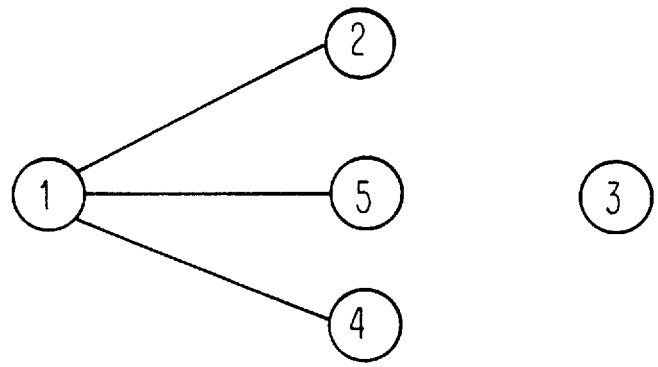

FIGS. 3a and 3b illustrate the function performed by steps 180–186. FIG. 3a represents a fragment of an "old" netlist in which all of components 1–5 have been found to respectively match components 1–5 in a "new" netlist (a fragment of which is shown in FIG. 3b). In FIG. 3a the immediate neighbors of component 1 are components 2, 3, and 4. In FIG. 3b component 3 is no longer directly connected to component 1. Instead, component 5 is now an immediate neighbor of component 1. The performance of steps 180–186 for component 1 in the old netlist (FIG. 3a) results in the connection between components 1 and 3 in that netlist being designated as changed. The performance of these steps for component 1 in the new netlist (FIG. 3b) results in the connection between components 1 and 5 in that netlist being designated as changed. This illustrates that even though none of the components may change between old and new netlists, connections between those components may change. Steps 180–186 are used to find those changed connections between unchanged components.

From the foregoing it will be seen that performance of the methods of this invention results in identification of matched components in both netlists, complementary identification of components in both netlists that do not match, and identification of changed connections in both netlists. Matched components represent unchanged portions of the old netlist. Unmatched components in the old netlist represent deleted portions of that netlist. Unmatched components in the new netlist represent new portions of that netlist. Connections identified as changed represent changed connections between unchanged components. This information is useful in reducing the amount of work that must be done to implement in physical circuitry the circuit design represented by the new netlist. For example, synthesis, partitioning, placing, and routing that has been performed for portions of the old netlist design that are not changed in the new netlist design can be reused rather than having to be done again "from scratch." Only for the new or changed portions of the new netlist design must all the implementation details be newly devised.

Computer software for implementing the methods of FIG. 1 can be included at the appropriate point in computer software systems of the type mentioned above (e.g., the MAX+PLUS II system). Operationally, this software addition functions between (1) the circuit design and netlist creation modules, and (2) the modules for implementing netlists in physical circuitry. This software addition identifies the portion of previous work done by the latter modules that can be reused and therefore does not have to be redone to implement a new netlist.

It will be understood that the foregoing is only illustrative of the principles of the invention, and that various modifications can be made by those skilled in the art without departing from the scope and spirit of the invention. For example, it has been pointed out in connection with several of the steps shown in FIG. 1 that references to the "old" and "new" netlists in those steps can be reversed with no change in the result. As another example of modifications within the scope of this invention, the term "netlist" is used herein as a convenient shorthand term for certain kinds of circuit design information. It will be understood that the methods of this invention are applicable to these kinds of information, even though that information may not be embodied in something called a netlist. For example, the circuit design information could be found in a graphical representation (like FIGS. 2a, 2b, 3a, or 3b) rather than in any form of list. As still another example of possible modifications, it may not be necessary to produce actual lists of matched and/or unmatched components. Instead, it may be sufficient to simply record a flag associated with each component indicative of whether the component is matched or unmatched. The flag can include the identification of the matching component in the other netlist. It may not be necessary or desired in all cases to perform all phases that are included in the presently preferred embodiment shown in FIG. 1.

The invention claimed is:

1. A non-graphical method for identifying portions of a new circuit design that are substantially similar to portions of an old circuit design, each of said designs including a plurality of components and a plurality of connections between various ones of said components, each of said components having a user-assigned name and a basic feature set, said method comprising the steps of:

comparing the name of each component in a first of said designs to the names of components in a second of said designs in order to tentatively match components with the same name;

comparing the basic feature sets of each pair of components that have been tentatively matched on the basis of name in order to finalize the match of only those component pairs with the same basic feature set;

assigning a signature to each component that has not been finally matched on the basis of name, said signature being indicative of the basic feature set of the associated component and, if necessary to achieve uniqueness of all signatures for each design, the basic feature sets of components that are adjacent to said associated components;

comparing the signature of each component having a signature in a first of said designs to the signatures of components having signatures in a second of said designs in order to tentatively match components with the same signature;

comparing the basic feature sets of each pair of components that have been tentatively matched on the basis of signature in order to finalize the match of only those component pairs with the same basic feature sets;

for a component that has not been finally matched on the basis of name or signature, determining whether that component has an immediate neighbor component that has been finally matched, components being immediate neighbors if they are directly connected to one another by one of said connections;

if said component considered in said determining step has a finally matched immediate neighbor component, then selecting the component that matches said immediate neighbor component; and if a component has been selected in said selecting step, then comparing the basic feature set of any as yet unmatched immediate neighbor component of said selected component to the basic feature set of said component considered in said determining step in order to finally match the components being compared if their basic feature sets are the same.

2. The method defined in claim 1 wherein said assigning step further comprises the step of:

replacing with necessarily unique signatures any signatures that are duplicated in either design when based on the basic feature sets of the components within a predetermined maximum degree of remoteness from the component for which a signature is being assigned.

3. The method defined in claim 2 wherein said replacing step comprises the step of:

using random, non-reproducible signatures to replace said signatures that are duplicated.

4. The method defined in claim 2 wherein said maximum degree of remoteness includes immediate neighbor components of immediate neighbor components of said component for which a signature is being assigned.

5. The method defined in claim 1 further comprising the steps of:

considering a finally matched component;

identifying any finally matched immediate neighbor component of said component considered in said considering step;

further identifying the component that was finally matched to the component considered in said considering step;

still further identifying any finally matched immediate neighbor components of said component identified in said further identifying step; and determining whether any of said components identified in said still further identifying step is the component that was finally matched to the component identified in said identifying step, and if not, then designating as changed the connection between the component considered in said considering step and the component identified in said identifying step.

6. A non-graphical method for identifying portions of a new circuit design that are substantially similar to portions of an old circuit design, each of said designs including a plurality of components and a plurality of connections between various ones of said components, each of said components having a basic feature set, said method comprising the steps of:

assigning signatures to components in each of said designs, each signature being indicative of the basic feature set of the component to which it is assigned;

identifying any signature that is duplicated for a design;

replacing the signature of any component, whose signature is identified as duplicated in said identifying step, with a new signature that is indicative of the basic feature set of said component whose signature is being replaced and the basic feature sets of components that are connected to said component whose signature is being replaced via paths made of said connections, none of said paths including more than a predetermined number of said connections in series;

further identifying any signature that results from said replacing step that is duplicated for a design;

effectively eliminating from further consideration on the basis of signatures any component whose signature is identified as duplicated in said further identifying step; and comparing the signature of each component having a signature in a first of said designs to the signatures of components having signatures in a second of said designs in order to match components with the same signature.

7. The method defined in claim 6 further comprising the step of:

further comparing the basic feature sets of each pair of components that have been matched in said comparing step in order to confirm the match of only those component pairs with the same basic feature set.

8. The method defined in claim 6 wherein in said predetermined number is two.

9. The method defined in claim 6 wherein said effectively eliminating step comprises the step of:

further replacing the signature of any component, whose signature is identified as duplicated in said further identifying step, with a further new signature that is known to be unique for the signatures for that design.

10. The method defined in claim 9 wherein each said further new signature is a random, non-reproducible signature.

11. A non-graphical method for identifying portions of a new circuit design that are substantially similar to portions of an old circuit design, each of said designs including a plurality of components and a plurality of connections between various ones of said components, said method comprising the steps of:

for components in a first of said designs, identifying any respectively matching components in a second of said designs;

considering a matched component;

further identifying any matched component that is an immediate neighbor component of said component considered in said considering step, components being immediate neighbors if they are directly connected to one another by one of said connections;

still further identifying the component that was matched to the component considered in said considering step;

yet still further identifying any matched immediate neighbor components of said component identified in said still further identifying step; and determining whether any of said components identified in said yet still further identifying step is the component that was matched to the component identified in said further identifying step, and if not, then designating as changed the connection between the component considered in said considering step and the component identified in said further identifying step.

12. The method defined in claim 11 where said components have user-assigned names, and wherein said identifying step comprises the step of:

comparing the name of a component in said first design with the names of components in said second design in order to match components with the same name.

13. The method defined in claim 12 wherein said components have basic feature sets, and wherein said identifying step further comprises the step of:

further comparing the basic feature sets of a pair of components that have been matched in said comparing step in order to confirm the match of said pair of components only if the basic feature sets of those components are the same, and to otherwise rescind the match of said pair of components.

14. The method defined in claim 11 wherein said components have basic feature sets, and wherein said identifying step further comprises the steps of:

assigning signatures to said components, each signature being indicative of the basic feature set of the component to which that signature is being assigned and, if necessary to avoid duplication of signatures within a design, the basic feature sets of components that are within a predetermined degree of remoteness from said component to which said signature is being assigned; and comparing the signature of a component in said first design with the signatures of components in said second design in order to match components with the same signature.

15. The method defined in claim 14 wherein said assigning step comprises the step of:

effectively eliminating from further consideration on the basis of signature any components whose signatures do not avoid duplication within a design when indicative of the basic feature sets referred to in said assigning step.

16. The method defined in claim 15 wherein said effectively eliminating step comprises the step of:

changing the signatures of said components whose signatures do not avoid duplication to non-reproducible signatures.

17. The method defined in claim 16 wherein said non-reproducible signatures are random signatures.

18. The method defined in claim 14 wherein said components have basic features sets, and wherein said identifying step further comprises the step of:

further comparing the basic feature sets of a pair of components that have been matched in said comparing step in order to confirm the match of said pair of components only if the basic feature sets of those components are the same, and to otherwise rescind the match of said pair of components.

19. A non-graphical method for identifying portions of a new netlist that are substantially similar to portions of an old netlist, each of said netlists being non-hierarchical and representing a plurality of components and a plurality of connections between various ones of said components, each of said components having a user-assigned name, said method comprising the step of:

comparing the name of each component in a first of said designs to the names of components in a second of said designs in order to tentatively match components with the same name.

20. The method defined in claim 19 where each of said components has a basic feature set, and wherein said method further comprises the step of:

comparing the basic feature sets of each pair of components that have been tentatively matched on the basis of name in order to finalize the match of only those component pairs with the same basic feature set.

* * * * *